United States Patent
Muchsel et al.

(10) Patent No.: US 9,654,111 B1
(45) Date of Patent: May 16, 2017

(54) SYSTEMS AND METHODS FOR PROTECTING DATA USING RECONFIGURABLE LOGIC PATHS

(71) Applicant: Maxim Integrated Products, Inc., San Jose, CA (US)

(72) Inventors: Robert Michael Muchsel, Addison, TX (US); Edward Tangkwai Ma, Plano, TX (US); Donald Wood Loomis, III, Coppell, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/659,363

(22) Filed: Mar. 16, 2015

Related U.S. Application Data

(60) Provisional application No. 62/078,554, filed on Nov. 12, 2014.

(51) Int. Cl.
  *H03K 19/177* (2006.01)
(52) U.S. Cl.
  CPC . *H03K 19/17768* (2013.01); *H03K 19/17736* (2013.01)
(58) Field of Classification Search
  CPC ....... H03K 19/17736; H03K 19/17748; H03K 19/17768
  See application file for complete search history.

(56) References Cited

U.S. PATENT DOCUMENTS

| | | | | |
|---|---|---|---|---|
| 5,517,506 A | * | 5/1996 | Underwood ... | G01R 31/318371 714/720 |
| 5,825,888 A | * | 10/1998 | Kimura ................ | H04H 20/62 380/262 |
| 7,269,738 B1 | * | 9/2007 | Kivimaki ............. | H04L 9/0625 380/277 |
| 7,801,298 B2 | * | 9/2010 | Fischer .................. | H04L 9/003 380/28 |
| 8,370,642 B2 | * | 2/2013 | Nobukata .............. | H04L 9/003 380/255 |

(Continued)

FOREIGN PATENT DOCUMENTS

WO  WO 2015166496 A1 * 11/2015 ........... G06F 21/558

*Primary Examiner* — Alexander H Taningco
*Assistant Examiner* — Kurtis R Bahr
(74) *Attorney, Agent, or Firm* — North Weber & Baugh LLP

(57) ABSTRACT

Various embodiments of the invention allow to protect data in a logic circuit from being detected by commonly known observation methods. In certain embodiments, this is accomplished by selecting a set of reconfigurable logic blocks within the logic circuit to form a routing path in such a manner that the circuit performs a given function while making it virtually impossible to follow data through the circuit as the data is being processed. The routing path may be selected in a random or pseudorandom fashion, for example, in response to detecting an environmental change. In some embodiments, known data is injected into the logic path and the output is compared to a known value. If the result is incorrect, for example, because a section of the hardware ceased to properly perform due to a faulty circuit component, signals are routed through an operational part of the circuit to provide a different and valid logic path, while avoiding faulty logic gates.

20 Claims, 6 Drawing Sheets

(56) References Cited

U.S. PATENT DOCUMENTS

| | | | | |
|---|---|---|---|---|
| 8,724,804 B2* | 5/2014 | Kawabata | ............... | H04L 9/003 |
| | | | | 380/264 |
| 9,038,151 B1* | 5/2015 | Chua | ....................... | H04L 45/02 |
| | | | | 709/223 |
| 9,218,505 B1* | 12/2015 | Wesselkamper | ......... | G06F 21/72 |
| 2002/0103010 A1* | 8/2002 | Thomas | ................ | H04W 24/00 |
| | | | | 455/560 |
| 2003/0048903 A1* | 3/2003 | Ito | ........................... | H04L 9/003 |
| | | | | 380/263 |
| 2005/0270061 A1* | 12/2005 | Otterstedt | ............... | G06F 21/75 |
| | | | | 326/38 |
| 2006/0236102 A1* | 10/2006 | Golic | .................... | H04L 9/0618 |
| | | | | 713/168 |
| 2007/0296458 A1* | 12/2007 | Kelem | ............. | H03K 19/17736 |
| | | | | 326/41 |
| 2009/0003598 A1* | 1/2009 | Itoh | ........................ | H04L 9/003 |
| | | | | 380/46 |
| 2009/0060194 A1* | 3/2009 | Mackey | ................ | G06F 21/554 |
| | | | | 380/277 |
| 2011/0066988 A1* | 3/2011 | Habermann | ........ | G06F 17/5022 |
| | | | | 716/106 |
| 2012/0213360 A1* | 8/2012 | Le Quere | ............. | G06F 9/3877 |
| | | | | 380/28 |
| 2013/0305199 A1* | 11/2013 | He | ..................... | G06F 17/5054 |
| | | | | 716/104 |
| 2015/0346246 A1* | 12/2015 | Tasher | ............. | G01R 19/16552 |
| | | | | 324/762.01 |

* cited by examiner

| X | Y | Output |
|---|---|--------|
| 0 | 0 | 0 |
| 0 | 1 | 1 |
| 1 | 0 | 1 |
| 1 | 1 | 0 |

SYSTEMS AND METHODS FOR PROTECTING DATA USING RECONFIGURABLE LOGIC PATHS

CROSS REFERENCE TO RELATED PATENT APPLICATIONS

This application is related to and claims the priority benefit of U.S. Provisional Application No. 62/078,554, filed Nov. 12, 2014, titled "Systems and methods for protecting data using reconfigurable logic paths," listing as inventors, Robert Michael Muchsel, Edward Tangkwai Ma, and Donald Wood Loomis III, which application is hereby incorporated herein by reference in its entirety.

BACKGROUND

A. Technical Field

The present invention relates to digital circuits and, more particularly, to systems, devices, and methods of protecting data by using reconfigurable digital logic circuit paths.

B. Background of the Invention

Numerous methods to encrypt, obfuscate, and hide information have been employed in the software domain for a long time. One invention, titled "System and Method for Enhancing Confidentiality using Logic Gate Encryption," by common authors suggests encryption of logic gates in the hardware domain as a means to protect a circuit from reverse engineering and theft of valuable IP or information by making it extremely difficult for potential intruders to identify operational logic functions for the purpose of discovering critical keying material. However, encryption of logic gates alone does not prevent a determined attacker from discovering confidential data that is processed by the concealed circuit.

In many cases, a secure circuit implements a standard, non-proprietary algorithm, such as a common AES encryption. Unlike the data and the critical keying material processed by the algorithm, the encryption algorithm itself is neither secret nor worthy of protection. Side channel attacks represent one category of intruder attacks frequently employed to uncover secret information, such as encryption keys, passwords, and other cryptographic data.

In a differential side channel attack, the attacker may perform hundreds if not thousands of calls to a function that the attacker attempts to break by performing statistical analysis on characteristic properties, such as electromagnetic emissions emanating from the circuit under investigation (e.g., characteristic emissions caused by transitions in current), power consumption, and timing information of signals. By doing so the intruder takes advantage of the fact that these properties are closely associated with and reflect the physical implementation of the encryption engine and the operations performed on the data processed by the particular encryption algorithm. Different instructions, for example, will have different power consumption profiles, such that after monitoring the circuit under investigation, collecting sufficient data, and filtering out noise by statistical means, details of the system behavior can be inferred from the obtained data and the secret information can be reconstructed, thereby, rendering the system vulnerable and compromising the security of the entire system.

In detail, the implementation of the algorithm into a secure system causes current to flow through a given logic circuit from which knowledge about the circuit and the data processed by logic circuitry is inadvertently revealed to the surroundings of the circuit. For example, in a point-of-sale terminal comprising a circuit with five AND gates and five OR gates has a fixed location and allows the data and current associated with that data to travel through the gates that have permanent locations, which makes logic operations within the circuit prone to being probed for the purpose of tracing and extracting information regarding the abovementioned circuit properties and the circuit design.

There exist several approaches aimed at protecting a circuit by increasing the level of difficulty of carrying out this type of non-intrusive attacks and prevent the leakage of "readable" information from the logic circuit to a potential observer. One such approach to improve security relies on modifying the encryption algorithm and performing operations on both the actual bits of a secret key as well as the inverse thereof.

Another approach, shown in FIG. 1, employs a plurality of small, internal capacitors that electrically decouple and, thus, isolate an external power supply from the to-be-protected circuit in order to frustrate monitoring activities on the power lines. The circuit in FIG. 1 is implemented on a smart card 10 and includes capacitors 3 and 4 that can be embedded within the smart card substrate. In operation, switch 8 alternately switches between capacitors 3 and 4 such that that, at any given time, one of the two capacitors is charged by the external power supply, while the other capacitor delivers power to smart card 10. This, in effect, causes the power supply to be decoupled from the circuit, making it more difficult to directly observe the power consumption of the circuit from which the adversary wishes to deduct information. However, this approach does not prevent the motivated attacker from examining the signals radiated by the decoupling capacitors 3, 4, or employ more sophisticated means such as infrared emission analysis to obtain the sought after information indirectly.

Another type of attack on a circuit is the method is fault injection. Using this method, the adversary, in preparation of an attack, manipulates a circuit that normally undergoes random operations in such a manner as to force the circuit to deviate from its regular cryptographic operations and switch into a less random mode. For example, by purposefully raising the voltage applied to the circuit the attacker may trigger a certain circuit response that, in effect, reduces the randomness of operations and allows control of the circuit behavior, thereby, making it easier to successfully carry out the attack.

However, it remains fundamental to the success of a differential side-channel attack that the same sequence of algorithmically determined logic operations is repeated many times over, so as to give the attacker an opportunity to apply the statistical analysis necessary to discover the relationship between the collected data and the inner workings of the circuit under investigation.

What is needed are tools for designers of secure systems to overcome the above-described limitations.

DETAILED DESCRIPTION OF THE PREFERRED EMBODIMENTS

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize that additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily referring to the same embodiment.

Furthermore, connections between components or between method steps in the figures are not restricted to connections that are affected directly. Instead, connections illustrated in the figures between components or method steps may be modified or otherwise changed through the addition thereto of intermediary components or method steps, without departing from the teachings of the present invention.

In this document a matrix configuration constructed from reconfigurable logic blocks is presented for illustration purposes. It is noted that circuit components herein may be connected in any arbitrary, multidimensional pattern, have any number of inputs and outputs, and may use any combination of configurable and non-configurable logic devices.

Figure 1:
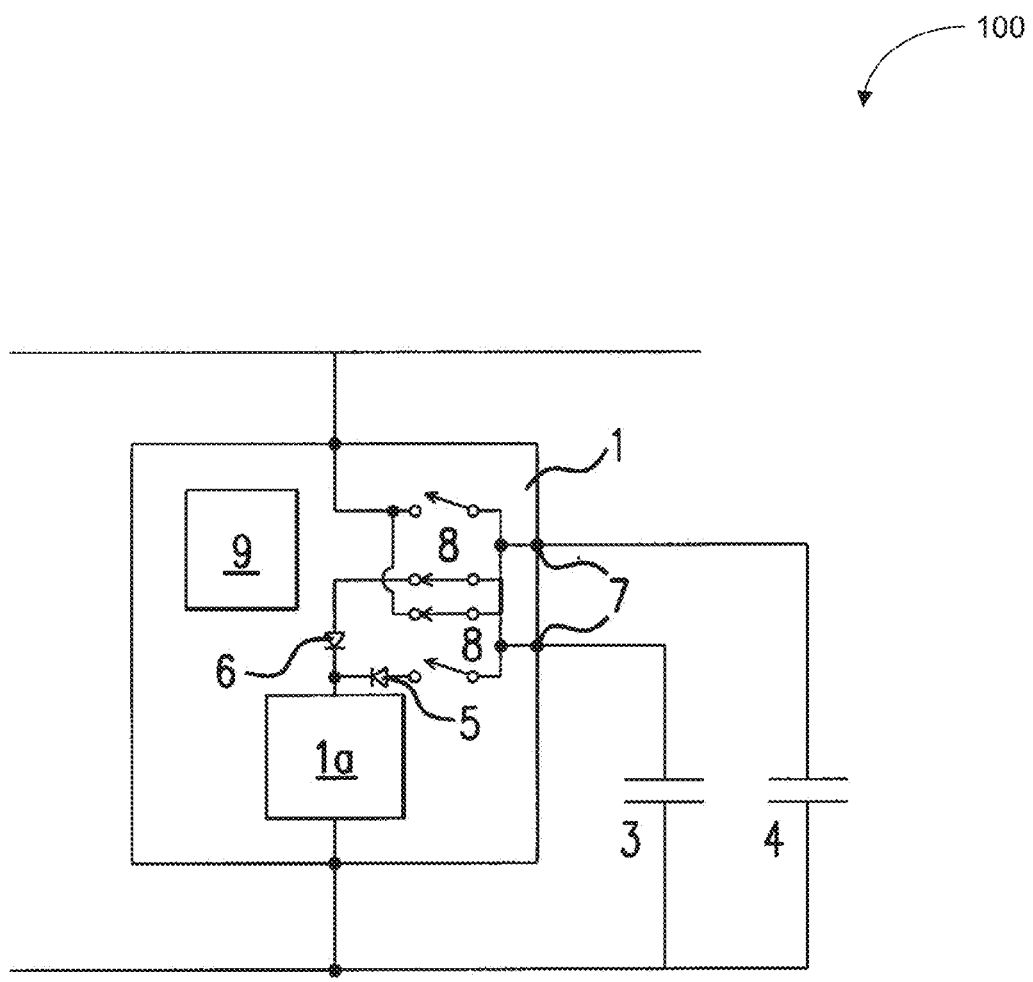
FIG. 1 shows prior art approach to protect information about a circuit comprising logic elements.
Figure 2:
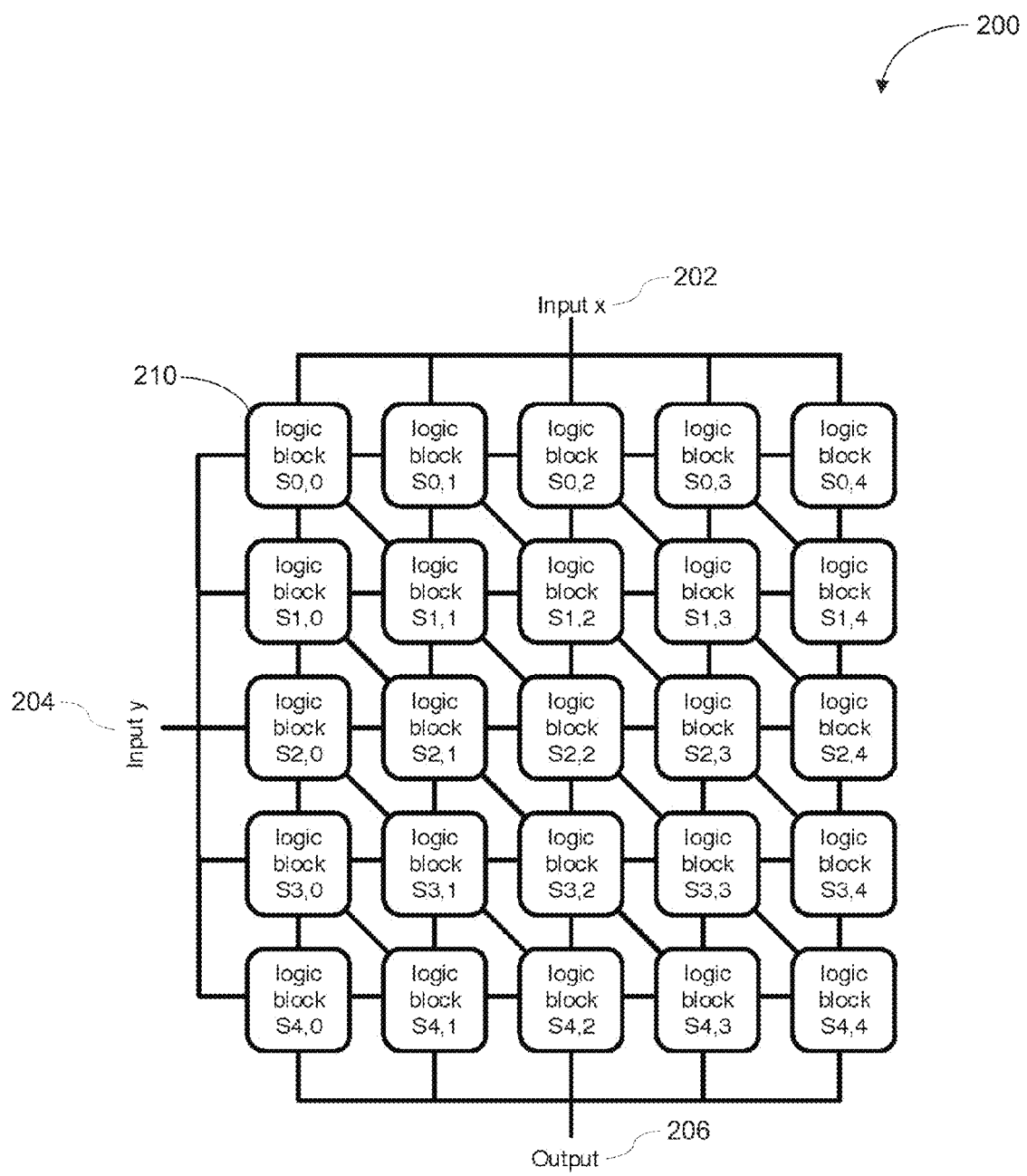
FIG. 2 generally illustrates a matrix configuration constructed from reconfigurable logic blocks, according to various embodiments of the invention.

FIG. 2 illustrates a circuit configuration that comprises reconfigurable logic blocks, according to various embodiments of the invention. Circuit 200 comprises input x 202, input y 204, output 206, and twenty-five logic blocks 210 that are coupled to have some connectivity with each other. Circuit 200 in example in FIG. 2 is arranged in a matrix fashion, wherein some or all logic blocks 210 in the matrix are implemented as universal, reconfigurable logic blocks. Logic matrix 200 is arranged in a manner such that each logic block can have multiple inputs and outputs. For example, the logic block denoted as "logic block S2,2" has three inputs and three outputs. In practice, such a logic block may be implemented as a 3-input NAND device.

In one embodiment, logic blocks 210 are connected to each other in an irregular pattern. It is noted, that the inventors envision any number of inputs and outputs to logic matrix 200 or logic blocks 210 therein. Therefore, any number of unlimited additional multidimensional inputs and outputs are possible. In addition, logic blocks 210 need not necessarily be reconfigurable or universal but may be any other type of logic circuitry.

In operation, each logic block 210 receives input signals from one or more adjacent logic blocks 210 (or from an external source not shown in FIG. 2) and performs a function that generates one or more outputs 206 based on input signals 202-204 that logic block 210 receives. In one embodiment, the logic configuration bits of logic block 210 are configured in different way at different times, such that the same logic block 210 performs different operations at two different instances.

The type of operation may be selectable for some or all individual logic blocks 210 in matrix 200. Since logic expressions can be realized using many different combinations of logic gates, multiple unique "paths" through logic matrix 200 may be created and utilized. For a given set of input signals 204, each path may yield the same output 206.

Several valid paths or sequences through logic matrix 200 may exist, such that more than one valid operation may produce the same valid result or output. For example, an ordered sequence determined by logic blocks S0,0; S1,1; S2,1; S3,2; and S4,2 may represent a valid sequence resulting in valid output 206, while another acceptable sequence producing the same valid output 206 would be, for example, S1,0; S1,1; S2,2; S3,3; and S4,3. In one embodiment, a different logic path is randomly selected for each round of a round-based cryptographic algorithm, and a different sequence of logic paths is selected each time a selection algorithm is invoked. In one embodiment, the routing decision is based on a secret and randomized process that utilizes a random number generator.

The possible variations in routing paths provides for a routing scheme that actively hides the trace of a selected path from one operation to the other. Additionally, this re-routing scheme provides numerous advantages, including that the resulting variations in timing and power consumption confound statistical analyses, thereby, successfully frustrating potential fault injection attempts by intruders.

In one embodiment, the system is configured to detect and react to unexpected changes in environmental conditions by performing operations in a different manner, including the possibility to perform deliberately wrong logic operations that may be chosen to be purposefully distracting. In other words, when conditions that directly affect the circuit (e.g., temperature) change, the system reacts by performing differently than had the change not occurred. Since conditions may change randomly, a different logic path is automatically but randomly chosen each time a change occurs.

As a result, the switching from one logic path to another creates a noise pattern that makes an investigation of the system extremely difficult, because attempts to manipulate and control the unpredictable operating conditions through fault injection do not aid the attacker in discovering valuable information about normal, regular operation conditions of the original circuit configuration.

Switching between different logic paths within matrix 200 may be implemented as part of the system, for example, by employing a control block (not shown) that actively controls the order and timing of switching events. One of ordinary skill in the art will appreciate that any suitable physical arrangement or structure may be used to form logic matrix 200 to accomplish the same or similar effects. It is noted that it is irrelevant that an attacker would know whether a known encryption algorithm, such as AES, is used or not, because it is data, e.g., the content of a secret encryption key, that is being protected against detection by observation of the system.

A further benefit of the system outlined above is increased fault tolerance. In one embodiment, known data is injected into a logic path and output 206 is compared to a known value. If the result is incorrect, for example, because a section of the hardware ceased to properly perform due to a faulty circuit component, signals may be routed through another part of the matrix 200 that is still operational, in order to provide a different, valid logic path. In turn, the faulty path in conjunction with its malfunctioning logic gates may be excluded from further use. For example, if a gate on the left side of matrix 200 turns defect, an alternative path through the right side of matrix 200 may be chosen to perform subsequent operations.

Overall, the implementation of a redundant and intricate method to use logic elements in different order when performing a given function makes it virtually impossible to follow the data through the logic circuit for the purpose of discovering the data as it is processed by the logic circuit.

Figure 3:
FIG. 3 shows a prior art truth table having two input signals.
Figure 4:
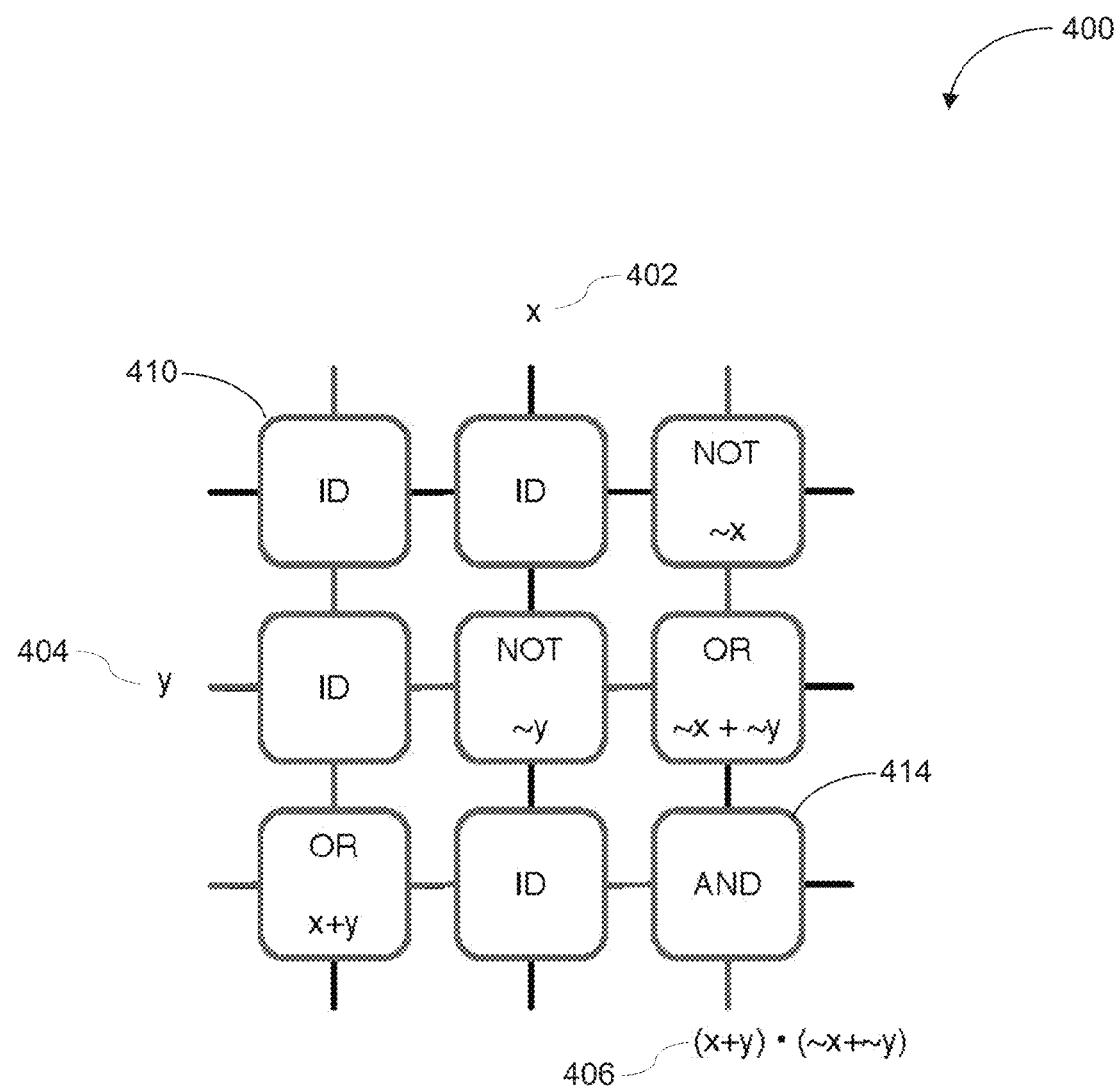
FIG. 4 illustrates an exemplary logic circuit in matrix configuration utilizing reconfigurable logic blocks to perform logic operations on a given path to implement the results in table in FIG. 3, according to various embodiments of the invention.

FIG. 3 shows a prior art truth table having two input signals and one output signal. FIG. 4 illustrates an exemplary logic circuit in matrix configuration utilizing reconfigurable logic blocks to perform logic operations on a given path to implement the results in table in FIG. 3, according to various embodiments of the invention. Matrix 400 comprises input x 402, input y 404, output 406, and nine logic blocks 410 coupled in a regular 3×3 pattern matrix. As shown in example in FIG. 4, all logic blocks 410 are reconfigurable and have two inputs and two outputs. Elements denoted as "ID" indicate logic blocks whose input is identical to their output with respect to logic operations.

In operation, some elements in matrix 400 are chosen to perform the functions NOT, OR, and AND in order to generate output 406 as a function of input 402-404 of matrix 400. The matrix arrangement in FIG. 4 results in only one useful output 406 (x+y)*(NOT x+NOT y) at that position 414 ("AND"). One skilled in the art will appreciate that a different result can exist at another position of matrix 400.

Figure 5:
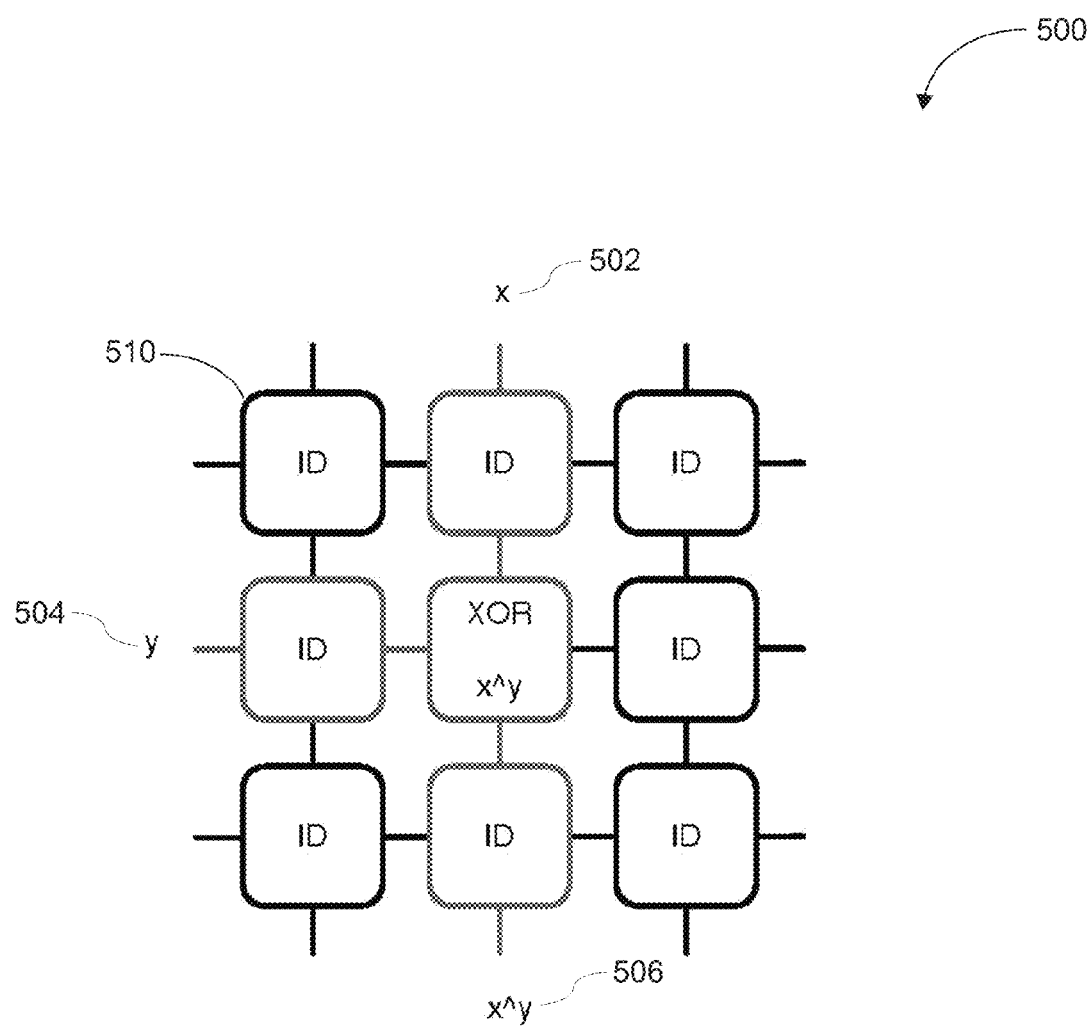
FIG. 5 illustrates the same matrix as in FIG. 4 configured in such a way that logic gates enable a different path to perform different logic operations to implement table in FIG. 3, according to various embodiments of the invention.

FIG. 5 illustrates the same matrix as in FIG. 4 configured in such a way that logic gates enable a different path to perform different logic operations to implement table in FIG. 3, according to various embodiments of the invention. For clarity, components similar to those shown in FIG. 4 are labeled in the same manner. For purposes of brevity, a description or their function is not repeated here.

In a manner similar to FIG. 4, some elements in matrix 500 in FIG. 5 are chosen to perform the function XOR in order to generate output 506 (x^y) as a function of input signals 502-504. Even though the result is identical in both FIG. 4 and FIG. 5, the physical location of the processing, the timing of the processing and the logical operations themselves may differ. For example, depending on the complexity of each logic operation that is performed within each logic block 510, the runtime of a selected path may differ from that of other paths. One of ordinary kill in the art will appreciate that other combinations of logic gates can be chosen to create the desired logic expression resulting in numerous unique paths through logic matrix 500.

In one embodiment, many-valued logic is used to describe an algorithm and determine conditions for switching from one path to another. For example, fuzzy logic may be used to create a number of bins with different weights (e.g., no, maybe, strong maybe, and yes), such that depending on the bin into which a given value falls, a certain path is chosen and an appropriate action is performed. One advantage of this embodiment is that the level of complexity of the system introduced by multiple paths that use binary logic can, thus, be managed more efficiently without substantially increasing die area and complexity. In one embodiment, the function that decides which bin to select is made dependent on more than one environmental variable, for example, supply voltage and temperature.

Figure 6:
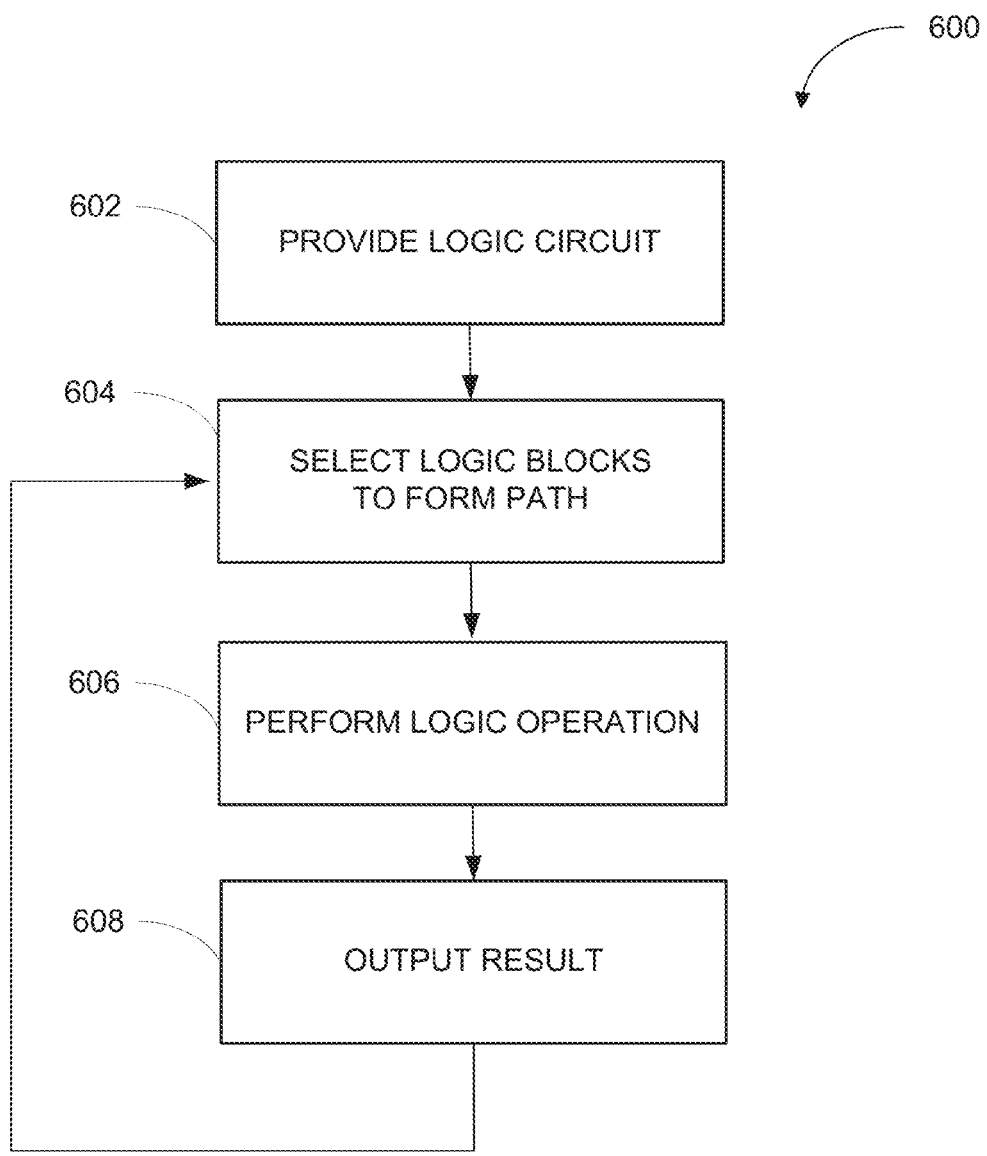
FIG. 6 is a flowchart of an illustrative process for protecting data utilizing reconfigurable logic blocks, in accordance with various embodiments of the invention.

FIG. 6 is a flowchart of an illustrative process for protecting data utilizing reconfigurable logic blocks, in accordance with various embodiments of the invention. The process for protecting data in a logic circuit starts at step 602 by providing a logic circuit that comprises reconfigurable logic blocks.

At step 604, all or a subset of logic blocks is selected to form a routing path from at least one input of the logic circuit to at least one output. It is noted that, in some embodiments, the selected subset may be selected in a random or pseudo-random fashion, for example, in response to detecting an environmental change.

At step 606, the circuit performs a logic operation according to its connections.

At step 608, the circuit outputs a result as a function of its one or more inputs, and returns to step 604 to select a new, different path on which to perform the logic operation and outputs the result.

It will be appreciated by those skilled in the art that fewer or additional steps may be incorporated with the steps illustrated herein without departing from the scope of the invention. No particular order is implied by the arrangement of blocks within the flowchart or the description herein.

It will be further appreciated that the preceding examples and embodiments are exemplary and are for the purposes of clarity and understanding and not limiting to the scope of the present invention. It is intended that all permutations, enhancements, equivalents, combinations, and improvements thereto that are apparent to those skilled in the art, upon a reading of the specification and a study of the drawings, are included within the scope of the present invention. It is therefore intended that the claims include all such modifications, permutations, and equivalents as fall within the true spirit and scope of the present invention.

We claim:

1. A logic circuit to protect data, the logic circuit comprising:
   a logic circuit; and
   logic blocks arranged in a predetermined pattern within the logic circuit, the logic blocks comprising:
      one or more inputs configured to receive input signals; and
      one or more outputs configured to generate output signals based on the input signals, the logic blocks configured to form at least two valid routing paths through the logic circuit, each routing path representing an ordered sequence of the logic blocks and comprising at least one input and output of the logic circuit that performs a logic operation according to one of the at least two valid routing paths to output a valid result, the valid result from each valid routing path being the same, wherein at least one logic block performs different logic operations in the at least two valid routing paths.

2. The logic circuit according to claim 1, wherein one or more logic blocks are reconfigurable universal logic blocks.

3. The logic circuit according to claim 1, wherein the predetermined pattern is a multidimensional logic matrix.

4. The logic circuit according to claim 1, further comprising a controller that causes a switching event that varies the routing path in a manner so as to conceal a property of the routing path.

5. The logic circuit according to claim 4, wherein the controller controls an order and timing of the switching event in response to detecting an environmental condition to automatically and randomly select a logic path.

6. The logic circuit according to claim 5, wherein the environmental condition affects a regular operation of the logic circuit.

7. The logic circuit according to claim 4, wherein the controller reconfigures logic configuration bits of at least one logic block to perform different operations.

8. The logic circuit according to claim 4, wherein the controller is configured to perform a substitute logic operation that generates an invalid result to generate a noise pattern.

9. The logic circuit according to claim 4, wherein the controller is configured to vary the routing path in response to detecting a faulty circuit component that would otherwise lead to an invalid logic path.

10. The logic circuit according to claim 9, wherein the controller is further configured to inject data into the logic path and compare the output to a known value.

11. A method to protect data in a logic circuit, the method comprising:
    selecting logic blocks in a logic circuit, the logic blocks capable of forming at least two valid routing paths through the logic circuit, the at least two valid routing path each comprising at least one input and output of the logic circuit; and
    performing a logic operation according to one of the at least two valid routing paths such that the logic circuit outputs a valid result as a function of the at least one input and output, the valid result from each valid routing path being the same, wherein at least one logic block performs different logic operations in the at least two valid routing paths.

12. The method according to claim 11, further comprising varying routing paths on which to perform the logic operation so as to conceal a property of a selected path between operations.

13. The method according to claim 12, wherein the property comprises a power consumption pattern.

14. The method according to claim 11, wherein varying routing paths occurs in response to detecting an environmental condition, to automatically and randomly choose a different logic path.

15. The method according to claim 14, wherein varying routing paths comprises controlling an order and timing of switching events in a manner different from that if the environmental condition had not occurred.

16. The method according to claim 11, wherein selecting is based on a random or pseudorandom process.

17. The method according to claim 16, wherein selecting occurs as part of a round-based cryptographic algorithm.

18. The method according to claim 11, wherein varying routing paths occurs in response to detecting a faulty circuit component that would otherwise lead to an invalid logic path.

19. The method according to claim 11, wherein varying routing paths occurs in response to determining conditions based on a many-valued logic.

20. The method according to claim 19, wherein the many-valued logic is a fuzzy logic.

* * * * *